United States Patent
Vyas (10) Patent No.: US 11,922,025 B2
(45) Date of Patent: Mar. 5, 2024

(54) MEMORY DEVICE DEFECT SCANNING

(71) Applicant: Micron Technology, Inc., Boise, ID (US)

(72) Inventor: Udit Vyas, Bengaluru (IN)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 17/535,403

(22) Filed: Nov. 24, 2021

(65) Prior Publication Data

US 2023/0161482 A1     May 25, 2023

(51) Int. Cl.
*G06F 3/06*     (2006.01)

(52) U.S. Cl.
CPC .......... *G06F 3/0619* (2013.01); *G06F 3/0653* (2013.01); *G06F 3/0679* (2013.01)

(58) Field of Classification Search
CPC ..... G06F 3/0619; G06F 3/0653; G06F 3/0679
See application file for complete search history.

(56) References Cited

U.S. PATENT DOCUMENTS

| | | | |
|---|---|---|---|
| 7,873,885 B1 | 1/2011 | Shin et al. | |
| 8,131,911 B2 | 3/2012 | Yang et al. | |
| 9,928,126 B1* | 3/2018 | Shappir | G11C 11/5642 |
| 2014/0119113 A1* | 5/2014 | Xia | G11C 16/06 |
| | | | 365/185.03 |
| 2015/0134885 A1* | 5/2015 | Yeung | G06F 12/0246 |
| | | | 711/103 |
| 2016/0351270 A1* | 12/2016 | Ehrlich | G11C 16/3418 |
| 2020/0004455 A1* | 1/2020 | Williams | G06F 12/0246 |
| 2021/0233598 A1* | 7/2021 | Jean | G11C 16/3495 |
| 2022/0155956 A1* | 5/2022 | Rayaprolu | G11C 11/5642 |

FOREIGN PATENT DOCUMENTS

WO     2015076963 A1     11/2013

\* cited by examiner

*Primary Examiner* — Francisco A Grullon
(74) *Attorney, Agent, or Firm* — Brooks, Cameron & Huebsch, PLLC (57) ABSTRACT

A method includes determining that a criteria involving a memory device is met and performing a defect scan involving memory dice of the memory device in response to the criteria being met. The method further includes determining, as part of performing the defect scan, whether at least one memory die of the memory device has experienced degradation. The defect scan is performed as part of a quality and reliability assurance test or a reliability demonstration test, or both.

20 Claims, 5 Drawing Sheets

MEMORY DEVICE DEFECT SCANNING

TECHNICAL FIELD

Embodiments of the disclosure relate generally to memory sub-systems, and more specifically, relate to a memory device defect scanning.

BACKGROUND

A memory sub-system can include one or more memory devices that store data. The memory devices can be, for example, non-volatile memory devices and volatile memory devices. In general, a host system can utilize a memory sub-system to store data at the memory devices and to retrieve data from the memory devices.

BRIEF DESCRIPTION OF THE DRAWINGS

The present disclosure will be understood more fully from the detailed description given below and from the accompanying drawings of various embodiments of the disclosure.

DETAILED DESCRIPTION

Aspects of the present disclosure are directed to defect scanning in a memory sub-system, and in particular to memory sub-systems that include circuitry, such as a defect scan component, to perform a defect scan involving memory dice of the memory sub-system. A memory sub-system can be a storage system, storage device, a memory module, or a combination of such. An example of a memory sub-system is a storage system such as a solid-state drive (SSD). Examples of storage devices and memory modules are described below in conjunction with FIG. 1, et alibi. In general, a host system can utilize a memory sub-system that includes one or more components, such as memory devices that store data. The host system can provide data to be stored at the memory sub-system and can request data to be retrieved from the memory sub-system.

A memory device can be a non-volatile memory device. One example of non-volatile memory devices is a negative-and (NAND) memory device (also known as flash technology). Other examples of non-volatile memory devices are described below in conjunction with FIG. 1. A non-volatile memory device is a package of one or more dice. Each die can consist of one or more planes. Planes can be groups into logic units (LUN). For some types of non-volatile memory devices (e.g., NAND devices), each plane consists of a set of physical blocks. Each block consists of a set of pages. Each page consists of a set of memory cells ("cells"). A cell is an electronic circuit that stores information. A block hereinafter refers to a unit of the memory device used to store data and can include a group of memory cells, a word line group, a word line, or individual memory cells. For some memory devices, blocks (also hereinafter referred to as "memory blocks") are the smallest area than can be erased. Pages cannot be erased individually, and only whole blocks can be erased.

Each of the memory devices can include one or more arrays of memory cells. Depending on the cell type, a cell can store one or more bits of binary information, and has various logic states that correlate to the number of bits being stored. The logic states can be represented by binary values, such as "0" and "1", or combinations of such values. There are various types of cells, such as single level cells (SLCs), multi-level cells (MLCs), triple level cells (TLCs), and quad-level cells (QLCs). For example, a SLC can store one bit of information and has two logic states, while a TLC can store multiple bits of information and has eight logic states.

Some NAND memory devices employ a floating-gate architecture in which memory accesses are controlled based on a relative voltage change between the bit line and the word lines. Other examples of NAND memory devices can employ a replacement-gate architecture that can include the use of word line layouts that can allow for charges corresponding to data values to be trapped within memory cells based on properties of the materials used to construct the word lines. While both floating-gate architectures and replacement-gate architectures employ the use of select gates (e.g., select gate transistors), replacement-gate architectures can include multiple select gates coupled to a string of NAND memory cells. Further, replacement-gate architectures can include programmable select gates.

During the life of a memory device, and, particularly during the life of a memory device that utilizes non-volatile memory technology, the memory cells of the memory device can degrade and/or experience defects. For example, the ability of the memory cells to retain data accurately and/or provide accurate data in response to receipt of a memory access request can decrease over time. Stated alternatively, NAND memory cells can generally only sustain a finite quantity of erase cycles before the memory cells begin to fail to accurately retain data and/or become unusable.

In order to mitigate the effects of these properties of non-volatile memory cells, various techniques are employed, generally through the use of a controller such as a non-volatile memory controller. Examples of the techniques commonly utilized to mitigate the adverse effects experienced by such memory cells as a result of the memory cells being erased include wear leveling, block consolidation, and/or minimization of data migration in the memory device, among others. Although such techniques can alleviate some of the issues that can arise in a memory device as a result of the memory cells being repeatedly erased, they generally do not account for defects in memory dice and/or degradation to the memory dice over time on a die-by-die basis.

For example, some approaches can perform quality reliability assurance (QRA) testing to determine the overall quality of the memory dice of a memory device at the time of manufacture of the memory device. As used herein, the term "QRA testing" or "QRA test flow operation," as well as variants thereof, generally refers to QRA tests codified by the Joint Electron Device Engineering Counsel (JEDEC). For example, QRA testing can include performance of a set number of tests, such as a reliability demonstration test (RDT) that, if passed, certifies that a memory device qualifies for use for a particular quantity of cycles within a set quantity of failure rates, and a specific temperature test in which a memory device is subjected to a particular quantity of memory cycles (e.g., program-erase cycles) at a specific temperature to certify the memory device for use at a particular operating temperature for a certain quantity of memory cycles, among others. Notably, such QRA tests generally fail to perform defect scan testing, particularly once the memory device has left the manufacturing phase. Further, because some defects and/or degradation phenomenon can occur long after manufacture (e.g., years after the memory device has left the manufacturing facility and has been in use), such approaches fail to adequately perform QRA testing as the memory device degrades over time as a result of experiencing repeated erase cycles.

As will be appreciated, a RDT is generally performed by randomly selecting test data from a data distribution table and then performing one or more operations where the randomly selected test data is randomly injected into the memory device as either a sequential workload or a non-sequential workload and monitored for multiple hours or days. If it is determined that the memory device processed the randomly selected workloads with less than a threshold mean time between failures rate, the memory device is deemed to have passed the RDT and the memory device is deemed reliable enough to either have similar memory devices fabricated using similar components, or to leave a manufacturing facility and be sold to an end user of the memory device. However, because RDTs focus on the mean time between failure rate, conventional RDTs may not include performance of a defect scan, as described herein.

In these and other approaches, write failures and/or errors (e.g., uncorrectable errors) resulting from memory die defects and/or degradation may not be detected until after the write failure or an uncorrectable error is observed by a host that is executing a memory access operation involving the memory device and, hence, the memory dice of the memory device. By failing to contemplate the QRA testing paradigms disclosed herein, such approaches may incur additional system overhead in attempting to write data to, and/or retrieve data from memory cells that are contained in memory dice that include defects and/or that have experienced degradation during the life of the memory device. Further, bandwidth and/or power may be consumed in attempting to correct errors in such data that may be better allocated to other computing system operations.

Some other approaches may provide some insight into defects associated with a memory device and/or degradation of the memory dice of the memory device, however, such approaches generally do not provide a level of granularity suitable to determine memory die health on a die-by-die basis. For example, some approaches employ Self-Monitoring, Analysis and Reporting Technology (SMART) to monitor and/or records health characteristics of the memory device over time. In general, SMART is a monitoring system utilized by some memory devices to detect and report various indicators of drive reliability with the intent of anticipating imminent hardware failures. SMART can include the use of counters to track memory accesses to determine how many times and/or how frequently the memory device is accessed. However, SMART and/or SMART counters generally operate at the memory device level and therefore does not provide insight into memory die defects and/or degradation on a die-by-die basis. That is, SMART counters generally operate at the codeword level such that, for a memory device with sixteen (16) memory dice, a 160 byte codeword is utilized across all sixteen (16) memory dice with ten (10) bytes of data corresponding to each memory die. Under this model, it can be impossible to extract information corresponding to individual memory dice because the codeword is only able to provide insight into the health of all (in this example) sixteen (16) memory dice together. For example, around 4 kilobytes (KB) (e.g., 4,096 bytes) of codeword data may be received by the memory device. The 4 KB of codeword data can be split into two sections that are around 2 KB each. If the memory device contains sixteen channels per memory die (128 bytes), then 160 bytes of codeword data may be written to ten partitions of the memory die such that 16 bytes of codeword data is written to each of the partitions.

Aspects of the present disclosure address the above and other deficiencies by monitoring, recording, and/or reporting defects and/or degradation of individual memory dice. In some embodiments, the defects and/or degradation of the individual memory dice can be monitored, recorded, and/or reported during runtime of the memory device in which the memory dice are deployed. These and other aspects of the disclosure detailed herein allow for the overall performance of a memory device and, therefore, a computing system in which the memory device is deployed, to be improved in comparison to the approaches described above.

For example, as described in more detail herein, embodiments of the present disclosure allow for signaling associated with a media scan operation to be performed to monitor, record, and/or report memory die defects and/or memory die degradation on a die-by-die basis. In some embodiments, the signaling associated with the media scan operation(s) described herein are performed periodically (e.g., recurring at certain predetermined time intervals of operation of a memory device), aperiodically (e.g., at non-predetermined time intervals of operation of a memory device), and/or sporadically (e.g., in response to a determination that one or more criteria are met).

The signaling associated with the media scan operation(s) described herein can include signaling indicative of a QRA test flow operation and/or a RDT that includes performance of a defect scan (e.g., a memory scan that seeks to identify defects and/or degradation in memory dice) operation, in contrast to approaches that do not perform a defect scan operation in connection with performing a QRA test flow operation and/or in connection with performing a RDT, among other operations that can monitor, record, and/or report memory die defects and/or memory die degradation on a die-by-die basis.

As discussed in more detail, herein, such media scan operation(s) can include the writing of test data to memory cells of one or more memory dice in a memory device and, after some period of time, reading the test data from the one or more memory dice in the memory device. The read data can be compared to the written data to determine an amount of degradation experienced by the memory die from which the test data was read. Stated alternatively, performance of the defect scan operations described herein can allow for insight to physical degradation of individual memory dice due to age, wear, etc., as well as insight into physical defects of the individual memory dice, as opposed to merely the mean time between failure rate of the memory device.

Notably, such embodiments can allow for the amount of degradation (e.g., the health) of the memory die to be determined prior to fulfilling a memory access command to read data to a host. This can be beneficial to the overall operation of a computing system in which the memory device is operating by allowing for a determination to be made as to whether data from a particular memory die will likely contain uncorrectable errors due to the degradation of the memory die in which the data is stored. If it is determined that the data from the particular memory die will likely contain uncorrectable errors due to the degradation of the memory die in which the data is stored, the data may not be transferred to the host prior to being recovered, which reduces the burden on the host and reduces wasted clock cycles in transferring data that will likely contain uncorrectable errors due to the degradation of the memory die in which the data is stored.

Figure 1:
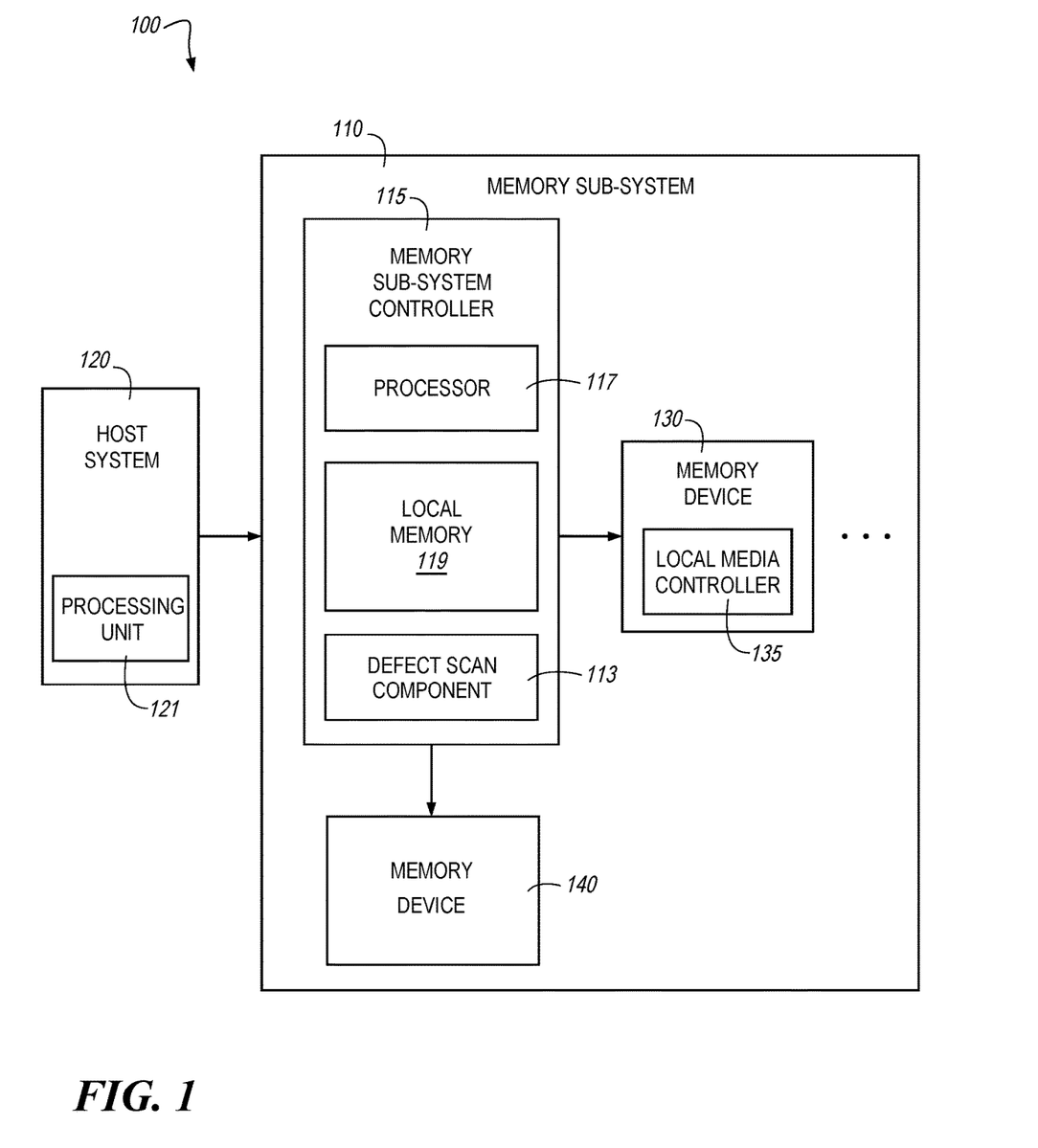
FIG. 1 illustrates an example computing system that includes a memory sub-system in accordance with some embodiments of the present disclosure.

FIG. 1 illustrates an example computing system 100 that includes a memory sub-system 110 in accordance with some embodiments of the present disclosure. The memory sub-system 110 can include media, such as one or more volatile memory devices (e.g., memory device 140), one or more non-volatile memory devices (e.g., memory device 130), or a combination of such.

A memory sub-system 110 can be a storage device, a memory module, or a hybrid of a storage device and memory module. Examples of a storage device include a solid-state drive (SSD), a flash drive, a universal serial bus (USB) flash drive, an embedded Multi-Media Controller (eMMC) drive, a Universal Flash Storage (UFS) drive, a secure digital (SD) card, and a hard disk drive (HDD). Examples of memory modules include a dual in-line memory module (DIMM), a small outline DIMM (SO-DIMM), and various types of non-volatile dual in-line memory modules (NVDIMMs).

The computing system 100 can be a computing device such as a desktop computer, laptop computer, server, network server, mobile device, a vehicle (e.g., airplane, drone, train, automobile, or other conveyance), Internet of Things (IoT) enabled device, embedded computer (e.g., one included in a vehicle, industrial equipment, or a networked commercial device), or such computing device that includes memory and a processing device.

The computing system 100 can include a host system 120 that is coupled to one or more memory sub-systems 110. In some embodiments, the host system 120 is coupled to different types of memory sub-system 110. FIG. 1 illustrates one example of a host system 120 coupled to one memory sub-system 110. As used herein, "coupled to" or "coupled with" generally refers to a connection between components, which can be an indirect communicative connection or direct communicative connection (e.g., without intervening components), whether wired or wireless, including connections such as electrical, optical, magnetic, and the like.

The host system 120 can include a processor chipset and a software stack executed by the processor chipset. The processor chipset can include one or more cores, one or more caches, a memory controller (e.g., an SSD controller), and a storage protocol controller (e.g., PCIe controller, SATA controller). The host system 120 uses the memory sub-system 110, for example, to write data to the memory sub-system 110 and read data from the memory sub-system 110.

The host system 120 includes a processing device 121. The processing unit 121 can be a central processing unit (CPU) that is configured to execute an operating system. In some embodiments, the processing unit 121 comprises a complex instruction set computer architecture, such an x86 or other architecture suitable for use as a CPU for a host system 120.

The host system 120 can be coupled to the memory sub-system 110 via a physical host interface. Examples of a physical host interface include, but are not limited to, a serial advanced technology attachment (SATA) interface, a peripheral component interconnect express (PCIe) interface, universal serial bus (USB) interface, Fibre Channel, Serial Attached SCSI (SAS), Small Computer System Interface (SCSI), a double data rate (DDR) memory bus, a dual in-line memory module (DIMM) interface (e.g., DIMM socket interface that supports Double Data Rate (DDR)), Open NAND Flash Interface (ONFI), Double Data Rate (DDR), Low Power Double Data Rate (LPDDR), or any other interface. The physical host interface can be used to transmit data between the host system 120 and the memory sub-system 110. The host system 120 can further utilize an NVM Express (NVMe) interface to access components (e.g., memory devices 130) when the memory sub-system 110 is coupled with the host system 120 by the PCIe interface. The physical host interface can provide an interface for passing control, address, data, and other signals between the memory sub-system 110 and the host system 120. FIG. 1 illustrates a memory sub-system 110 as an example. In general, the host system 120 can access multiple memory sub-systems via a same communication connection, multiple separate communication connections, and/or a combination of communication connections.

The memory devices 130, 140 can include any combination of the different types of non-volatile memory devices and/or volatile memory devices. The volatile memory devices (e.g., memory device 140) can be, but are not limited to, random access memory (RAM), such as dynamic random-access memory (DRAM) and synchronous dynamic random access memory (SDRAM).

Some examples of non-volatile memory devices (e.g., memory device 130) include negative-and (NAND) type flash memory and write-in-place memory, such as three-dimensional cross-point ("3D cross-point") memory device, which is a cross-point array of non-volatile memory cells. A cross-point array of non-volatile memory can perform bit storage based on a change of bulk resistance, in conjunction with a stackable cross-gridded data access array. Additionally, in contrast to many flash-based memories, cross-point non-volatile memory can perform a write in-place operation, where a non-volatile memory cell can be programmed without the non-volatile memory cell being previously erased. NAND type flash memory includes, for example, two-dimensional NAND (2D NAND) and three-dimensional NAND (3D NAND).

Each of the memory devices 130, 140 can include one or more arrays of memory cells. One type of memory cell, for example, single level cells (SLC) can store one bit per cell. Other types of memory cells, such as multi-level cells (MLCs), triple level cells (TLCs), quad-level cells (QLCs), and penta-level cells (PLC) can store multiple bits per cell. In some embodiments, each of the memory devices 130 can include one or more arrays of memory cells such as SLCs, MLCs, TLCs, QLCs, or any combination of such. In some embodiments, a particular memory device can include an SLC portion, and an MLC portion, a TLC portion, a QLC portion, or a PLC portion of memory cells. The memory cells of the memory devices 130 can be grouped as pages that can refer to a logical unit of the memory device used to store data. With some types of memory (e.g., NAND), pages can be grouped to form blocks.

Although non-volatile memory components such as three-dimensional cross-point arrays of non-volatile memory cells and NAND type memory (e.g., 2D NAND, 3D NAND) are described, the memory device 130 can be based on any other type of non-volatile memory or storage device, such as, read-only memory (ROM), phase change memory (PCM), self-selecting memory, other chalcogenide based memories, ferroelectric transistor random-access memory (FeTRAM), ferroelectric random access memory (FeRAM), magneto random access memory (MRAM), Spin Transfer Torque (STT)-MRAM, conductive bridging RAM (CBRAM), resistive random access memory (RRAM), oxide based RRAM (OxRAM), negative-or (NOR) flash memory, and electrically erasable programmable read-only memory (EEPROM).

The memory sub-system controller 115 (or controller 115 for simplicity) can communicate with the memory devices 130 to perform operations such as reading data, writing data, or erasing data at the memory devices 130 and other such operations. The memory sub-system controller 115 can include hardware such as one or more integrated circuits and/or discrete components, a buffer memory, or a combination thereof. The hardware can include digital circuitry with dedicated (i.e., hard-coded) logic to perform the operations described herein. The memory sub-system controller 115 can be a microcontroller, special purpose logic circuitry (e.g., a field programmable gate array (FPGA), an application specific integrated circuit (ASIC), etc.), or other suitable processor.

The memory sub-system controller 115 can include a processor 117 (e.g., a processing device) configured to execute instructions stored in a local memory 119. In the illustrated example, the local memory 119 of the memory sub-system controller 115 includes an embedded memory configured to store instructions for performing various processes, operations, logic flows, and routines that control operation of the memory sub-system 110, including handling communications between the memory sub-system 110 and the host system 120.

In some embodiments, the local memory 119 can include memory registers storing memory pointers, fetched data, etc. The local memory 119 can also include read-only memory (ROM) for storing micro-code. While the example memory sub-system 110 in FIG. 1 has been illustrated as including the memory sub-system controller 115, in another embodiment of the present disclosure, a memory sub-system 110 does not include a memory sub-system controller 115, and can instead rely upon external control (e.g., provided by an external host, or by a processor or controller separate from the memory sub-system).

In general, the memory sub-system controller 115 can receive commands or operations from the host system 120 and can convert the commands or operations into instructions or appropriate commands to achieve the desired access to the memory device 130 and/or the memory device 140. The memory sub-system controller 115 can be responsible for other operations such as wear leveling operations, garbage collection operations, error detection and error-correcting code (ECC) operations, encryption operations, caching operations, and address translations between a logical address (e.g., logical block address (LBA), namespace) and a physical address (e.g., physical block address, physical media locations, etc.) that are associated with the memory devices 130. The memory sub-system controller 115 can further include host interface circuitry to communicate with the host system 120 via the physical host interface. The host interface circuitry can convert the commands received from the host system into command instructions to access the memory device 130 and/or the memory device 140 as well as convert responses associated with the memory device 130 and/or the memory device 140 into information for the host system 120.

The memory sub-system 110 can also include additional circuitry or components that are not illustrated. In some embodiments, the memory sub-system 110 can include a cache or buffer (e.g., DRAM) and address circuitry (e.g., a row decoder and a column decoder) that can receive an address from the memory sub-system controller 115 and decode the address to access the memory device 130 and/or the memory device 140.

In some embodiments, the memory device 130 includes local media controllers 135 that operate in conjunction with memory sub-system controller 115 to execute operations on one or more memory cells of the memory devices 130. An external controller (e.g., memory sub-system controller 115) can externally manage the memory device 130 (e.g., perform media management operations on the memory device 130). In some embodiments, a memory device 130 is a managed memory device, which is a raw memory device combined with a local controller (e.g., local controller 135) for media management within the same memory device package. An example of a managed memory device is a managed NAND (MNAND) device.

The memory sub-system 110 can include a defect scan component 113. Although not shown in FIG. 1 so as to not obfuscate the drawings, the defect scan component 113 can include various circuitry to facilitate performance of operations to determine a temperature of memory cells of the memory device both at time when a write operation is performed and when a read operation involving the data written to the memory device is performed. The defect scan component 113 can perform operations to perform a defect scan as part of performance of a QRA test flow operation and/or RDT to determine whether individual memory dice of a memory device have incurred defects and/or have experienced degradation over the life of the memory device. As described herein, the defect scan performed as part of performance of the QRA test flow and/or RDT can be performed during runtime of the memory device, as opposed to merely at a manufacturing stage of the memory device. If it is determined that the individual memory dice of a memory device have incurred defects and/or have experienced degradation over the life of the memory device, the defect scan component 113 can refrain from transferring data from the individual memory dice to the host system 120 and can instead cause operations to recover the data to be performed prior to transferring data from the individual memory dice to the host system 120. The defect scan component 113 may be referred to herein in the alternative as a "controller," a "processing device," or a "processor," given the context of the disclosure.

Although the defect scan component 113 is illustrated as being resident on the memory sub-system controller 115, embodiments are not so limited. For example, the defect scan component 113 can be resident on the memory device 130 (e.g., resident on the local media controller), or can be resident on other component of the memory sub-system 110. As used herein, the term "resident on" refers to something that is physically located on a particular component. For example, the defect scan component 113 being "resident on" the memory sub-system controller 115 refers to a condition in which the hardware circuitry that comprises the defect scan component 113 is physically located on the memory sub-system controller 115. The term "resident on" can be used interchangeably with other terms such as "deployed on" or "located on," herein.

In some embodiments, the memory sub-system controller 115 includes at least a portion of the defect scan component 113. For example, the memory sub-system controller 115 can include a processor 117 (processing device) configured to execute instructions stored in local memory 119 for performing the operations described herein. In some embodiments, the defect scan component 113 is part of the host system 110, an application, or an operating system.

In some embodiments, the memory sub-system 110, and hence the defect scan component 113, can be resident on a mobile computing device such as a smartphone, laptop, phablet, Internet-of-Things device, autonomous vehicle, or the like. As used herein, the term "mobile computing device" generally refers to a handheld computing device that has a slate or phablet form factor. In general, a slate form factor can include a display screen that is between approximately 3 inches and 5.2 inches (measured diagonally), while a phablet form factor can include a display screen that is between approximately 5.2 inches and 7 inches (measured diagonally). Examples of "mobile computing devices" are not so limited, however, and in some embodiments, a "mobile computing device" can refer to an IoT device, among other types of edge computing devices.

Figure 2A:
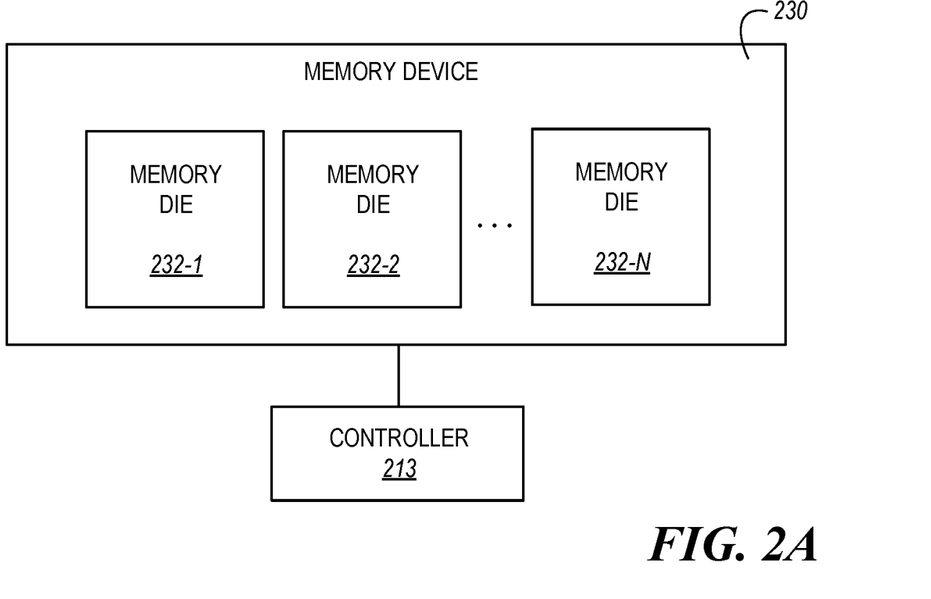
FIG. 2A illustrates an example memory device in accordance with some embodiments of the present disclosure.

FIG. 2A illustrates an example memory device 230 in accordance with some embodiments of the present disclosure. The memory device 230 can be analogous to the memory device 130 illustrated in FIG. 1, herein. As shown in FIG. 2A, the memory device 230 includes various memory dice 232 (e.g., the memory die 231-1, the memory die 232-1, . . . , the memory die 232-N). The memory dice 232 can, in some embodiments, include groups of NAND memory cells that can include combinations of SLCs, MLCs, TLCs, QLCs, and beyond. However, in at least one embodiment, one or more of the groups of memory cells includes TLCs and/or QLCs. In some embodiments, the groups of memory cells can be blocks of memory cells, pages of memory cells, word line groups comprising memory cells, blocks of memory cells associate with a memory die, superblocks of memory cells, etc.

As illustrated in FIG. 2A, the memory device 230 is coupled to a controller 213, which can be analogous to the defect scan component 113 illustrated in FIG. 1. As described above, the controller 213 can include special purpose circuitry in the form of an ASIC, FPGA, state machine, and/or other logic circuitry that can allow the controller 213 to orchestrate and/or perform operations described herein involving the memory device 230 and/or the memory dice 232. The controller 213 can be referred to in the alternative as a "processor" in the context of the disclosure. Each of the components (e.g., the memory device 230, the memory dice 232, and/or the controller 213) can be referred to collectively or individually as an "apparatus."

In a non-limiting example, an apparatus includes a memory device 230 comprising a plurality of memory dice 232-1 to 232-N and a controller 213 coupled to the memory device 230. The controller 213 determine that a criteria involving at least one memory die (e.g., the memory die 231-1) among the plurality of dice is met 232. In some embodiments, the criteria can correspond to an amount of time that the memory device 230 has been in operation. For example, degradation of the memory dice 232 may increase and/or become more pronounced the longer the memory device 230 is in operation (e.g., the longer the memory device 232 has been used "in the field"). In such embodiments, the controller 213 can determine that the memory device has been in operation for a threshold period of time to determine that the criteria is met. Embodiments are not so limited, however, and in some embodiments, the criteria can correspond to a quantity of program-erase cycles (PECs) experienced by the memory device 230 and, more specifically, to a quantity of PECs experienced by each memory die 232-1 to 232-N of the plurality of memory dice 232. For example, degradation of the memory dice 232 may increase and/or become more pronounced as the quantity of PECs experienced by the memory device 230 and/or by the memory dice 232. In such embodiments, the controller 213 can determine that at least the one memory die has undergone a threshold quantity of PECs to determine that the criteria is met.

Continuing with this example, the controller 213 can write test data to at least the one memory die in response to the determination that the criteria is met. In some embodiments, the test data can be associated with a QRA testing operation and/or a reliability demonstration test (RDT) that includes performance of a defect scan operation, or other such operation that is performed to determine a health or quality of the memory dice 232-1 to 232-N on a die-by-die basis.

The controller 213 can read, after a threshold period of time has elapsed, the test data from at least the one memory die and compare the test data read from at least the one memory die to the test data written to at least the one memory die to determine whether at least the one memory die has experienced degradation. Embodiments are not so limited, however, and in some embodiments, the controller can compare the test data read from at least the one memory die to the test data written to at least the one memory die to determine whether at least the one memory die includes defects (e.g., defects that may occur during manufacture of the memory die but may have become more pronounced over the life of the memory device).

In some embodiments, the controller 213 can write the test data, read the test data, and compare the test data read from at least the one memory die to the test data written to at least the one memory die in the absence of a host (e.g., the host system 120 illustrated in FIG. 1, herein) couplable to the memory device 230 detecting a write failure or a read failure involving at least the one memory die. For example, in contrast to other approaches, embodiments herein can allow for the controller 213 to write the test data, read the test data, and compare the test data read from at least the one memory die to the test data written to at least the one memory die to determine if at least the one memory die has experienced degradation that would result in the host detecting one or more uncorrectable errors in data requested by the host prior to fulfilling a memory access request to provide such data to the host. This can allow for the data to be recovered using the memory device (e.g., by performing data recovery techniques within the memory device and/or within a memory sub-system that includes the memory device) and transferred to the host to fulfill a memory access request without requiring the host to first receive the data, attempt to perform error recovery operations on the data, and issue a subsequent memory access request to the memory device.

In some embodiments, the controller 213 can write the test data, read the test data, and compare the test data read from at least the one memory die to the test data written to at least the one memory die during runtime of the memory device 230. In such embodiments, the controller 213 can write the test data, read the test data, and compare the test data read from at least the one memory die to the test data written to at least the one memory die as part of performance of a background media management operation (e.g., during idle time of the memory device 230 and/or during idle time of a host coupled to the memory device 230).

The controller 213 can write the test data to each memory die 232-1 to 232-N of the plurality of memory dice 232 independently of one another and can read the test data from each memory die 232-1 to 232-N of the plurality of memory dice 232 independently of one another. Further, the controller 213 can compare the test data read from each respective memory die 232-1 to 232-N to the test data written to each of the respective memory die 232-1 to 232-N independently of one another. That is, in some embodiments, the controller 213 can control application of signaling indicative of performing a test operation (e.g., a defect scan performed as part of a QRA testing operation and/or a RDT, etc.) to the memory dice 232-1 to 232-N independently such that health characteristics and/or quality characteristics of each of the memory dice 232-1 to 232-N can be determined independently from one another.

Figure 2B:
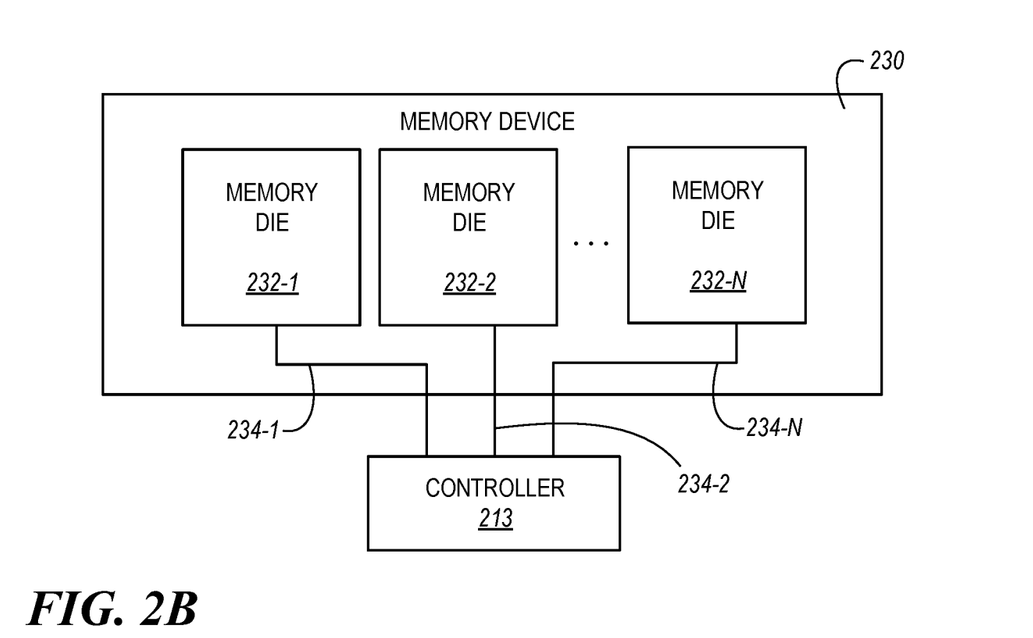
FIG. 2B illustrates another example memory device in accordance with some embodiments of the present disclosure.

FIG. 2B illustrates an example memory device 230 in accordance with some embodiments of the present disclosure. The memory device 230 can be analogous to the memory device 130 illustrated in FIG. 1, herein. As shown in FIG. 2B, the memory device 230 includes various memory dice 232 (e.g., the memory die 231-1, the memory die 232-1, ..., the memory die 232-N). The memory dice 232 can, in some embodiments, include groups of NAND memory cells that can include combinations of SLCs, MLCs, TLCs, QLCs, and beyond. However, in at least one embodiment, one or more of the groups of memory cells includes TLCs and/or QLCs. In some embodiments, the groups of memory cells can be blocks of memory cells, pages of memory cells, word line groups comprising memory cells, blocks of memory cells associate with a memory die, superblocks of memory cells, etc.

As illustrated in FIG. 2B, the memory dice 232 are coupled to a controller 213 via communication channels 234-1, 234-2 to 234-N. The controller 213 can be analogous to the defect scan component 113 illustrated in FIG. 1. As described above, the controller 213 can include special purpose circuitry in the form of an ASIC, FPGA, state machine, and/or other logic circuitry that can allow the controller 213 to orchestrate and/or perform operations described herein involving the memory device 230 and/or the memory dice 232. The controller 213 can be referred to in the alternative as a "processor" in the context of the disclosure. Each of the components (e.g., the memory device 230, the memory dice 232, and/or the controller 213) can be referred to collectively or individually as an "apparatus."

In some embodiments, the controller 213 can apply signaling (e.g., commands, etc.) to the individual memory dice 232 via the respective communication channels 234. For example, the controller 213 can apply signaling to the communication channel 234-1 to perform a test operation (e.g., a defect scan performed as part of a QRA testing operation and/or a RDT, an operation to write and/or read test data, etc.) targeting the memory die 232-1. Similarly, the controller 213 can apply signaling to the communication channel 234-2 to perform a test operation targeting the memory die 232-2. This can allow for the controller 213 to perform such test operations to determine health characteristics and/or quality characteristics of the memory dice 232 on a die-by-die basis.

Figure 3:
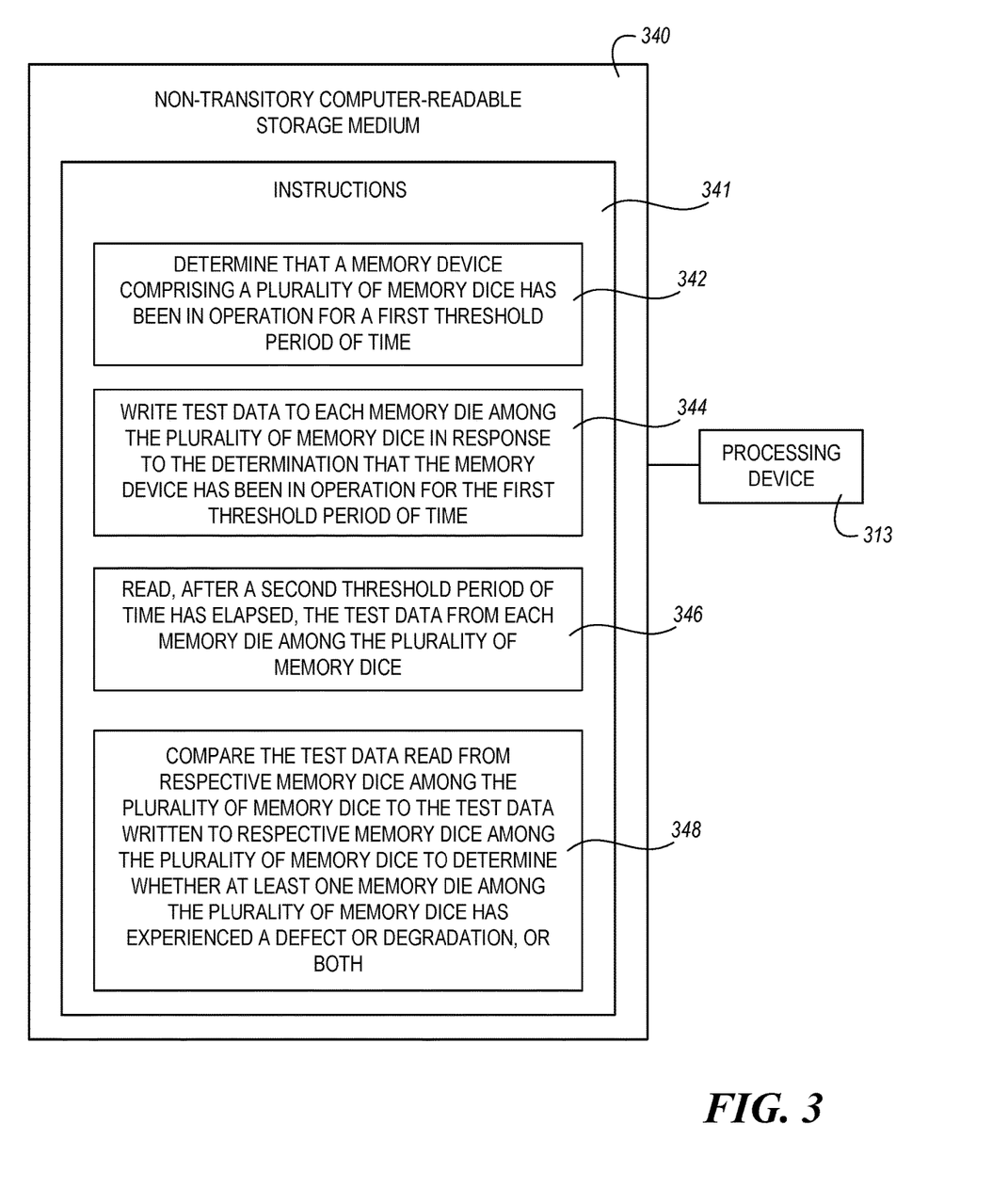
FIG. 3 illustrates an example of a non-transitory computer-readable medium comprising instructions executable by a processing device.

FIG. 3 illustrates an example of a non-transitory computer-readable medium 340 comprising instructions 341 executable by a processing device 313. In some embodiments, the processing device 313 can be analogous to the defect scan component 113 of FIG. 1 and/or the controller 213 of FIG. 2A and FIG. 2B. Although shown in a particular sequence or order, unless otherwise specified, the order of the processes can be modified. Thus, the illustrated embodiments should be understood only as examples, and the illustrated processes can be performed in a different order, and some processes can be performed in parallel. Additionally, one or more processes can be omitted in various embodiments. Thus, not all processes are required in every embodiment. Other process flows are possible.

As shown in FIG. 3, the instructions 342 can be executed by the processing device 313 to determine that a memory device comprising a plurality of memory dice has been in operation for a first threshold period of time. The memory device can be analogous to the memory device 130 illustrated in FIG. 1 and/or the memory device 230 illustrated in FIG. 2A and FIG. 2B, herein, while the memory dice can be analogous to the memory dice 232 illustrated in FIG. 2A and FIG. 2B, herein.

In some embodiments, the instructions 344 can be executed by the processing device 313 to write test data to each memory die among the plurality of memory dice in response to the determination that the memory device has been in operation for the first threshold period of time. The test data can be written to each memory die among the plurality of memory dice as part of performance of a defect scan operation that is performed as part of a QRA test flow operation and/or a RDT, as described herein.

The instructions 346 can be executed by the processing device 313 to read, after a second threshold period of time has elapsed, the test data from each memory die among the plurality of memory dice. The threshold period of time can be on the order of millisecond (e.g., 10 milliseconds, 20 milliseconds, etc.) or can be on the order of minutes (e.g., 1 minute, 2 minutes, etc.) depending on the architecture of the memory device. For example, for architectures that are highly sensitive to drift (e.g., to charge loss or charge gain while data is stored by the memory device), a highly critical and therefore, highly accurate defect scan operation may be able to be performed using a threshold period of time of 1 minute because any drift effects resulting from degradation of the memory die and/or defects of the memory die will have become sufficiently pronounced. However, in some architectures, it may be possible to use a shorter threshold period of time, such as 10 milliseconds to attain a reasonable resolution of the degradation of the memory die and/or defects of the memory die.

The instructions 348 can be executed by the processing device 313 to compare the test data read from respective memory dice among the plurality of memory dice to the test data written to respective memory dice among the plurality of memory dice to determine whether at least one memory die among the plurality of memory dice has experienced a defect or degradation, or both. For example, if the data is subjected to drift effects due to degradation of the memory die and/or defects of the memory die, there will be discrepancies between the test data read from respective memory dice among the plurality of memory dice and the test data written to respective memory dice among the plurality of memory dice. Such discrepancies can be indicative of degradation of the memory die and/or defects of the memory die. Embodiments are not limited to analysis of data failures that arise from drift effects, however, and other criterion, such as bit flips, uncorrectable errors, etc. can be analyzed between the test data read from respective memory dice among the plurality of memory dice and the test data written to respective memory dice among the plurality of memory dice to determine a level of degradation of the memory die and/or defects of the memory die.

In some embodiments, the processing device 213 can write the test data, read the test data, and compare the test read from respective memory dice among the plurality of memory dice to the test data written to respective memory dice among the plurality of memory dice for each memory die among the plurality of memory dice independently from one another. For example, as described above in connection with FIG. 2A and FIG. 2B, a test operation (e.g., a defect scan operation, a QRA testing flow, a RDT, etc.) can be performed by the processing device 313 on one or more of the memory dice independently from the other memory dice.

In some embodiments, the processing device 313 can write the test data, read the test data, and compare the test read from respective memory dice among the plurality of memory dice to the test data written to respective memory dice among the plurality of memory dice for each memory die among the plurality of memory dice during performance of a background media management operation during idle time of the memory device or during idle time of a host (e.g., the host system 120 illustrated in FIG. 1, herein) couplable to the memory device, or both.

As discussed above, the processing device 313 can write the test data, read the test data, and compare the test read from respective memory dice among the plurality of memory dice to the test data written to respective memory dice among the plurality of memory dice for each memory die among the plurality of memory dice in the absence of a host (e.g., the host system 120 illustrated in FIG. 1, herein) couplable to the memory device detecting a write failure or a read failure involving at least one of the plurality of memory dice.

Embodiments are not so limited, however, and in some embodiments, the processing device 313 can write the test data, read the test data, and compare the test read from respective memory dice among the plurality of memory dice to the test data written to respective memory dice among the plurality of memory dice for each memory die among the plurality of memory dice in the absence of a host (e.g., the host system 120 illustrated in FIG. 1, herein) couplable to the memory device detecting an uncorrectable error involving host data read from at least one of the plurality of memory dice.

Figure 4:
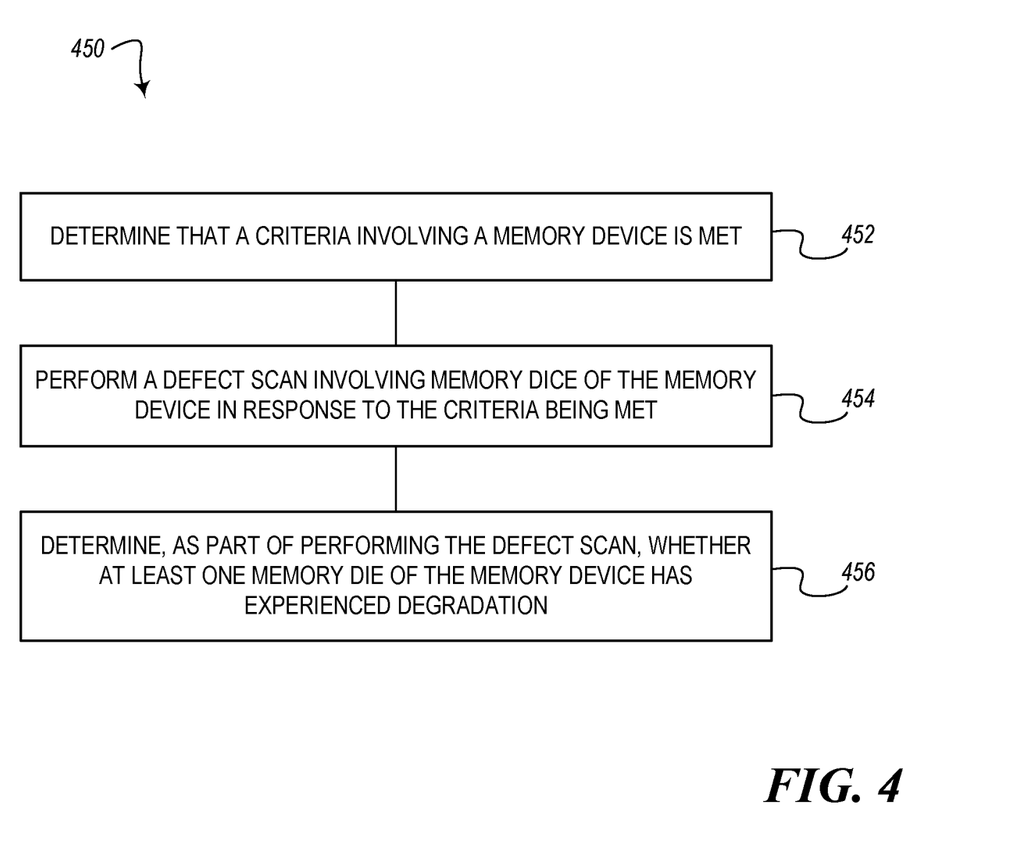
FIG. 4 is a flow diagram corresponding to a method for memory device defect scanning in accordance with some embodiments of the present disclosure.

FIG. 4 is a flow diagram corresponding to a method 450 for memory device defect scanning in accordance with some embodiments of the present disclosure. The method 450 can be performed by processing logic that can include hardware (e.g., processing device, circuitry, dedicated logic, programmable logic, microcode, hardware of a device, integrated circuit, etc.), software (e.g., instructions run or executed on a processing device), or a combination thereof. In some embodiments, the method 450 is performed by the defect scan component 113 of FIG. 1. Although shown in a particular sequence or order, unless otherwise specified, the order of the processes can be modified. Thus, the illustrated embodiments should be understood only as examples, and the illustrated processes can be performed in a different order, and some processes can be performed in parallel. Additionally, one or more processes can be omitted in various embodiments. Thus, not all processes are required in every embodiment. Other process flows are possible.

At operation 452 it can be determined that a criteria involving a memory device is met. The memory device can be analogous to the memory device 130 illustrated in FIG. 1 and/or the memory device 230 illustrated in FIG. 2A and FIG. 2. In some embodiments, determining that the criteria is met includes determining that the memory device has been in operation for a threshold period of time. Embodiments are not so limited, however, and in some embodiments, determining that the criteria is met includes determining that the memory dice of the memory device have undergone a threshold quantity of program-erase cycles.

At operation 454, a defect scan involving memory dice of the memory device can be performed in response to the criteria being met. The memory dice can be analogous to the memory dice 232 illustrated in FIG. 2A and FIG. 2B. In some embodiments, performing the defect scan includes analyzing each of the memory dice independently to determine whether the at least one memory die of the memory device has experienced the degradation.

As described above, the defect scan involving the memory dice can be performed during idle time of the memory device and/or during idle time of a host (e.g., the host system 120 illustrated in FIG. 1, herein) couplable to the memory device. In addition to, or in the alternative, the defect scan involving the memory dice can be performed in the absence of a host (e.g., the host system 120 illustrated in FIG. 1, herein) couplable to the memory device detecting a write failure or a read failure involving the at least one memory die.

At operation 456, it can be determined, as part of performing the defect scan, whether at least one memory die of the memory device has experienced degradation. As described above, such a determination can be based on a comparison of data written to the memory die, stored by the memory die for a threshold period of time, and subsequently read from the memory die. In response to determining that at least one memory die has experienced degradation, the method can include refraining from transferring data from the at least one memory die that experienced the degradation to a host system couplable to the memory device prior to performing one or more error recovery operations involving the data within the memory device.

In some embodiments, the method 450 can further include writing, as part of performing the defect scan, test data to the memory dice of the memory device and reading, after a threshold period of time has elapsed, the test data from the memory dice of the memory device. In such embodiments, the method 450 can further include comparing the test data read from the memory dice to the test data written to the memory dice to determine whether the at least one memory die of the memory device has experienced degradation.

Figure 5:
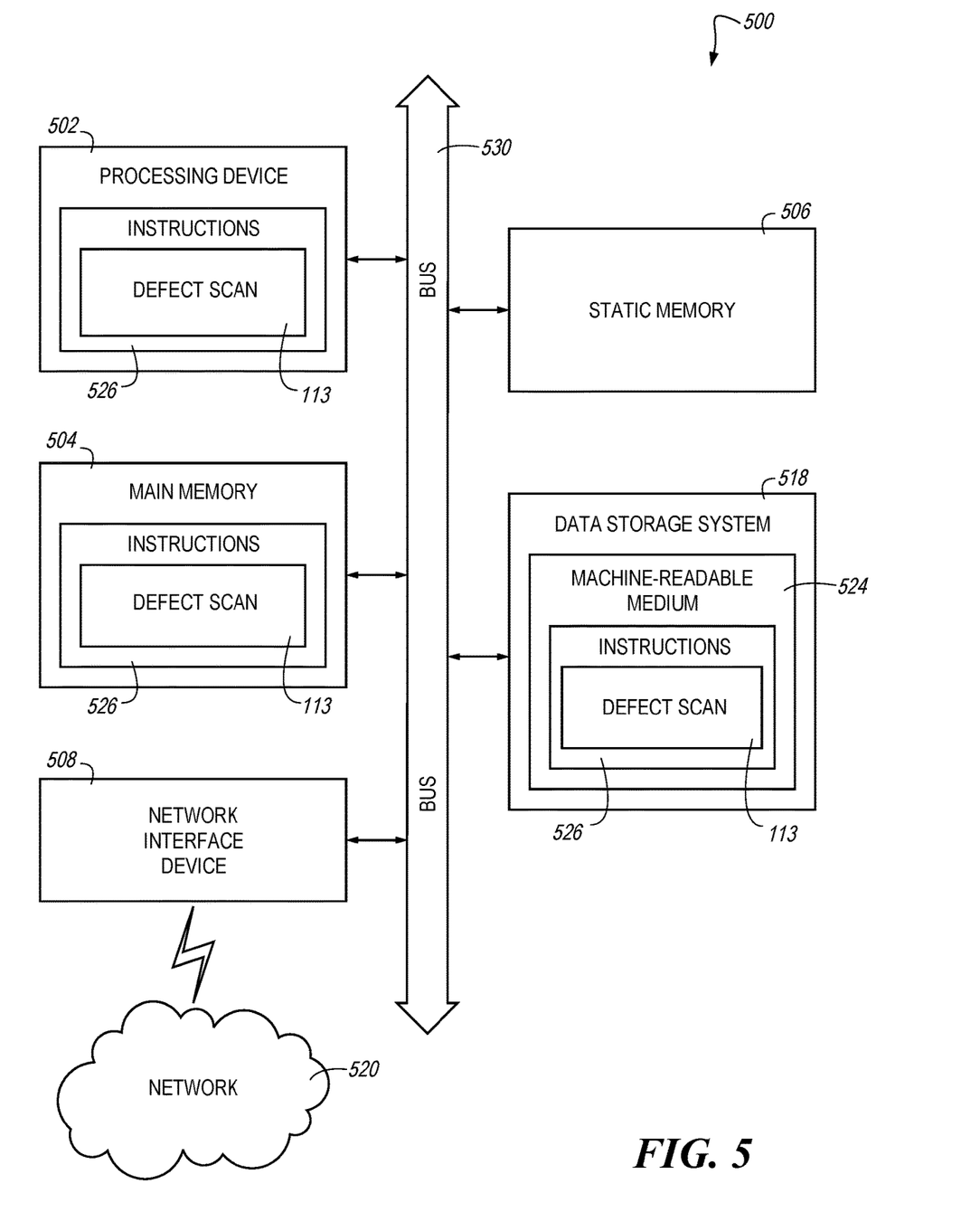
FIG. 5 is a block diagram of an example computer system in which embodiments of the present disclosure may operate.

FIG. 5 is a block diagram of an example computer system 500 in which embodiments of the present disclosure may operate. For example, FIG. 5 illustrates an example machine of a computer system 500 within which a set of instructions, for causing the machine to perform any one or more of the methodologies discussed herein, can be executed. In some embodiments, the computer system 500 can correspond to a host system (e.g., the host system 120 of FIG. 1) that includes, is coupled to, or utilizes a memory sub-system (e.g., the memory sub-system 110 of FIG. 1) or can be used to perform the operations of a controller (e.g., to execute an operating system to perform operations corresponding to the defect scan component 113 of FIG. 1). In alternative embodiments, the machine can be connected (e.g., networked) to other machines in a LAN, an intranet, an extranet, and/or the Internet. The machine can operate in the capacity of a server or a client machine in client-server network environment, as a peer machine in a peer-to-peer (or distributed) network environment, or as a server or a client machine in a cloud computing infrastructure or environment.

The machine can be a personal computer (PC), a tablet PC, a set-top box (STB), a Personal Digital Assistant (PDA), a cellular telephone, a web appliance, a server, a network router, a switch or bridge, or any machine capable of executing a set of instructions (sequential or otherwise) that specify actions to be taken by that machine. Further, while a single machine is illustrated, the term "machine" shall also be taken to include any collection of machines that individually or jointly execute a set (or multiple sets) of instructions to perform any one or more of the methodologies discussed herein.

The example computer system 500 includes a processing device 502, a main memory 504 (e.g., read-only memory (ROM), flash memory, dynamic random access memory (DRAM) such as synchronous DRAM (SDRAM) or Rambus DRAM (RDRAM), etc.), a static memory 506 (e.g., flash memory, static random access memory (SRAM), etc.), and a data storage system 518, which communicate with each other via a bus 530.

The processing device 502 represents one or more general-purpose processing devices such as a microprocessor, a central processing unit, or the like. More particularly, the processing device can be a complex instruction set computing (CISC) microprocessor, reduced instruction set computing (RISC) microprocessor, very long instruction word (VLIW) microprocessor, or a processor implementing other instruction sets, or processors implementing a combination of instruction sets. The processing device 502 can also be one or more special-purpose processing devices such as an application specific integrated circuit (ASIC), a field programmable gate array (FPGA), a digital signal processor (DSP), network processor, or the like. The processing device 502 is configured to execute instructions 526 for performing the operations and steps discussed herein. The computer system 500 can further include a network interface device 508 to communicate over the network 520.

The data storage system 518 can include a machine-readable storage medium 524 (also known as a computer-readable medium) on which is stored one or more sets of instructions 526 or software embodying any one or more of the methodologies or functions described herein. The instructions 526 can also reside, completely or at least partially, within the main memory 504 and/or within the processing device 502 during execution thereof by the computer system 500, the main memory 504 and the processing device 502 also constituting machine-readable storage media. The machine-readable storage medium 524, data storage system 518, and/or main memory 504 can correspond to the memory sub-system 110 of FIG. 1.

In one embodiment, the instructions 526 include instructions to implement functionality corresponding to a defect scan component (e.g., the defect scan component 113 of FIG. 1). While the machine-readable storage medium 524 is shown in an example embodiment to be a single medium, the term "machine-readable storage medium" should be taken to include a single medium or multiple media that store the one or more sets of instructions. The term "machine-readable storage medium" shall also be taken to include any medium that is capable of storing or encoding a set of instructions for execution by the machine and that cause the machine to perform any one or more of the methodologies of the present disclosure. The term "machine-readable storage medium" shall accordingly be taken to include, but not be limited to, solid-state memories, optical media, and magnetic media.

Some portions of the preceding detailed descriptions have been presented in terms of algorithms and symbolic representations of operations on data bits within a computer memory. These algorithmic descriptions and representations are the ways used by those skilled in the data processing arts to most effectively convey the substance of their work to others skilled in the art. An algorithm is here, and generally, conceived to be a self-consistent sequence of operations leading to a desired result. The operations are those requiring physical manipulations of physical quantities. Usually, though not necessarily, these quantities take the form of electrical or magnetic signals capable of being stored, combined, compared, and otherwise manipulated. It has proven convenient at times, principally for reasons of common usage, to refer to these signals as bits, values, elements, symbols, characters, terms, numbers, or the like.

It should be borne in mind, however, that all of these and similar terms are to be associated with the appropriate physical quantities and are merely convenient labels applied to these quantities. The present disclosure can refer to the action and processes of a computer system, or similar electronic computing device, that manipulates and transforms data represented as physical (electronic) quantities within the computer system's registers and memories into other data similarly represented as physical quantities within the computer system memories or registers or other such information storage systems.

The present disclosure also relates to an apparatus for performing the operations herein. This apparatus can be specially constructed for the intended purposes, or it can include a general purpose computer selectively activated or reconfigured by a computer program stored in the computer. Such a computer program can be stored in a computer readable storage medium, such as, but not limited to, any type of disk including floppy disks, optical disks, CD-ROMs, and magnetic-optical disks, read-only memories (ROMs), random access memories (RAMs), EPROMs, EEPROMs, magnetic or optical cards, or any type of media suitable for storing electronic instructions, each coupled to a computer system bus.

The algorithms and displays presented herein are not inherently related to any particular computer or other apparatus. Various general purpose systems can be used with programs in accordance with the teachings herein, or it can prove convenient to construct a more specialized apparatus to perform the method. The structure for a variety of these systems will appear as set forth in the description below. In addition, the present disclosure is not described with reference to any particular programming language. It will be appreciated that a variety of programming languages can be used to implement the teachings of the disclosure as described herein.

The present disclosure can be provided as a computer program product, or software, that can include a machine-readable medium having stored thereon instructions, which can be used to program a computer system (or other electronic devices) to perform a process according to the present disclosure. A machine-readable medium includes any mechanism for storing information in a form readable by a machine (e.g., a computer). In some embodiments, a machine-readable (e.g., computer-readable) medium includes a machine (e.g., a computer) readable storage medium such as a read only memory ("ROM"), random access memory ("RAM"), magnetic disk storage media, optical storage media, flash memory devices, etc.

In the foregoing specification, embodiments of the disclosure have been described with reference to specific example embodiments thereof. It will be evident that various modifications can be made thereto without departing from the broader spirit and scope of embodiments of the disclosure as set forth in the following claims. The specification and drawings are, accordingly, to be regarded in an illustrative sense rather than a restrictive sense.

What is claimed is:

1. A method, comprising:
receiving a memory access command from a host and determining that a criteria involving a memory device is met, wherein the criteria includes a number of program-erase cycles (PECs) for at least one memory die of a number of memory dice of the memory device is above a threshold quantity;
performing a defect scan involving the number of memory dice of the memory device in response to receiving the memory access command and the criteria being met by scanning each of the number of memory dice on an entire die-by-entire die basis;
determining, as part of performing the defect scan, whether at least one memory die of the memory device has experienced degradation; and
responsive to determining that the at least one memory die has experienced degradation, refraining from fulfilling the memory access command to read data written to the at least one memory die that has experienced the degradation, performing a recovery operation for user data on the at least one memory die requested by the memory access command, and transfer the recovered user data to the host to fulfill the memory access command.

2. The method of claim 1, wherein determining that the criteria is met includes determining that the memory device has been in operation for a threshold period of time.

3. The method of claim 1, wherein the degradation of each memory die is evaluated through test data including: bit flips, drift effects and uncorrectable errors.

4. The method of claim 1, wherein performing the defect scan includes analyzing each of the number of memory dice independently to determine whether the at least one memory die of the memory device has experienced the degradation.

5. The method of claim 1, further comprising performing the defect scan as part of performing a quality and reliability test involving the number of memory dice during idle time of the memory device or during idle time of a host couplable to the memory device, or both.

6. The method of claim 1, further comprising performing the defect scan involving the number of memory dice in the absence of a host couplable to the memory device detecting a write failure or a read failure involving the at least one memory die.

7. The method of claim 1, further comprising:
writing, as part of performing the defect scan, test data to the number of memory dice of the memory device;
reading, after a threshold period of time has elapsed, the test data from the number of memory dice of the memory device; and
comparing the test data read from the number of memory dice to the test data written to the number of memory dice to determine whether the at least one memory die of the memory device has experienced degradation.

8. An apparatus, comprising:
a memory device comprising a plurality of memory dice; and
a controller couplable to the memory device, wherein the controller is configured to:
receive a memory access command from a host and determine that a criteria involving the plurality of memory dice is met, wherein the criteria includes a number of program-erase cycles (PECs) for at least one memory die of the plurality of memory dice of the memory device is above a threshold quantity;
write test data to the at least one memory die in response to the determination that the criteria is met;
read, after a threshold period of time has elapsed, the test data from the at least one memory die; and
compare the test data read from the at least one memory die to the test data written to the at least one memory die to determine whether the at least one memory die has experienced degradation; and
responsive to determine at the at least one memory die has experienced degradation, refraining from fulfilling the memory access command to read data written to the at least one memory die that has experienced the degradation, performing a recovery operation for user data on the at least one memory die requested by the memory access command, and transfer the recovered user data to a host to fulfill the memory access command.

9. The apparatus of claim 8, wherein the controller is further configured to determine that the memory device has been in operation for a threshold period of time to determine that the criteria is met.

10. The apparatus of claim 8, wherein the degradation of each memory die is evaluated through test data including: bit flips, drift effects and uncorrectable errors.

11. The apparatus of claim 8, wherein the controller is further configured to write the test data, read the test data, and compare the test data read from the at least one memory die to the test data written to the at least one memory die in the absence of a host couplable to the memory device detecting a write failure or a read failure involving the at least one memory die.

12. The apparatus of claim 8, wherein the controller is further configured to write the test data, read the test data, and compare the test data read from the at least one memory die to the test data written to the at least one memory die as part of performance of a quality and reliability test or a reliability demonstration test, or both.

13. The apparatus of claim 8, wherein the controller is further configured to write the test data, read the test data, and compare the test data read from the at least one memory die to the test data written to the at least one memory die during runtime of the memory device.

14. The apparatus of claim 8, wherein the controller is further configured to:
write the test data to each memory die of the plurality of memory dice independently of one another;
read the test data from each memory die of the plurality of memory dice independently of one another; and
compare the test data read from each respective memory die to the test data written to each of the respective memory die independently of one another.

15. The apparatus of claim 8, wherein the memory device comprises a NAND memory device or a three-dimensional crosspoint memory device.

16. A non-transitory computer-readable storage medium comprising instructions that, when executed by a processing device, cause the processing device to:
receive a memory access command from a host and determine that a criteria involving a memory device is met, wherein the criteria includes a number of program-erase cycles (PECs) for at least one memory die of a number of memory dice of the memory device is above a threshold quantity;
determine that the memory device has been in operation for a first threshold period of time;

write test data to each memory die of the number of memory dice in response to the determination that the memory device has been in operation for the first threshold period of time;

read, after a second threshold period of time has elapsed, the test data from each memory die of the number of memory dice; and compare the test data read from respective memory dice of the number of memory dice to the test data written to respective memory dice of the number of memory dice to determine whether at least one memory die of the number of memory dice has experienced a defect or degradation, or both; and responsive to a determination that the at least one memory die has experienced degradation, refraining from fulfilling the memory access command to read data written to the at least one memory die that has experienced the degradation, performing a recovery operation for user data on the at least one memory die requested by the memory access command, and transfer the recovered user data to a host to fulfill the memory access command.

17. The non-transitory computer-readable storage medium of claim 16, wherein the processing device is further to write the test data, read the test data, and compare the test read from respective memory dice of the number of memory dice to the test data written to respective memory dice of the number of memory dice for each memory die of the number of memory dice independently from one another.

18. The non-transitory computer-readable storage medium of claim 16, wherein the processing device is further to write the test data, read the test data, and compare the test read from respective memory dice of the number of memory dice to the test data written to respective memory dice of the number of memory dice for each memory die of the number of memory dice during performance of a background media management operation during idle time of the memory device or during idle time of a host couplable to the memory device, or both.

19. The non-transitory computer-readable storage medium of claim 16, wherein the processing device is further to write the test data, read the test data, and compare the test read from respective memory dice of the number of memory dice to the test data written to respective memory dice of the number of memory dice for each memory die of the number of memory dice in the absence of a host couplable to the memory device detecting a write failure or a read failure involving at least one of the number of memory dice.

20. The non-transitory computer-readable storage medium of claim 16, wherein the processing device is further to write the test data, read the test data, and compare the test read from respective memory dice of the number of memory dice to the test data written to respective memory dice of the number of memory dice for each memory die of the number of memory dice in the absence of a host couplable to the memory device detecting an uncorrectable error involving host data read from at least one of the number of memory dice.

* * * * *